United States Patent
Yokoyama et al.

(10) Patent No.: US 6,242,327 B1
(45) Date of Patent: Jun. 5, 2001

(54) COMPOUND SEMICONDUCTOR DEVICE HAVING A REDUCED SOURCE RESISTANCE

(75) Inventors: Mitsunori Yokoyama; Hitoshi Tanaka; Jun Wada, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/083,398

(22) Filed: May 22, 1998

(30) Foreign Application Priority Data

Sep. 19, 1997 (JP) .................................................. 9-255783
Feb. 6, 1998 (JP) .................................................. 10-025597

(51) Int. Cl.$^7$ .................................................. H01L 21/20
(52) U.S. Cl. .................................................. 438/507; 117/104
(58) Field of Search .................................. 438/514, 506, 438/507; 117/104; 148/33.4

(56) References Cited

U.S. PATENT DOCUMENTS 4,903,089 * 2/1990 Hollis et al. ............................ 357/22
5,017,517 * 5/1991 Mochizuki et al. .................... 437/90
5,338,389 * 8/1994 Nishizawa et al. .................... 117/89

FOREIGN PATENT DOCUMENTS

| 53-81087 | 7/1978 | (JP) . |
| 53-81088 | 7/1978 | (JP) . |
| 53-81089 | 7/1978 | (JP) . |
| 5-29218 | 2/1993 | (JP) . |
| 6-112124 | 4/1994 | (JP) . |
| 7-58011 | 3/1995 | (JP) . |

* cited by examiner

Primary Examiner—Olik Chaudhuri
Assistant Examiner—Douglas A. Willie
(74) Attorney, Agent, or Firm—Armstrong, Westerman, Hattori, McLeland & Naughton

(57) ABSTRACT

A compound semiconductor device includes a low resistance source and drain region covered by a protective layer of a compound semiconductor device carrying thereon a source electrode or a drain electrode. Further, a low resistance source and drain region formed by a regrowth process of a compound semiconductor material is disclosed.

22 Claims, 13 Drawing Sheets

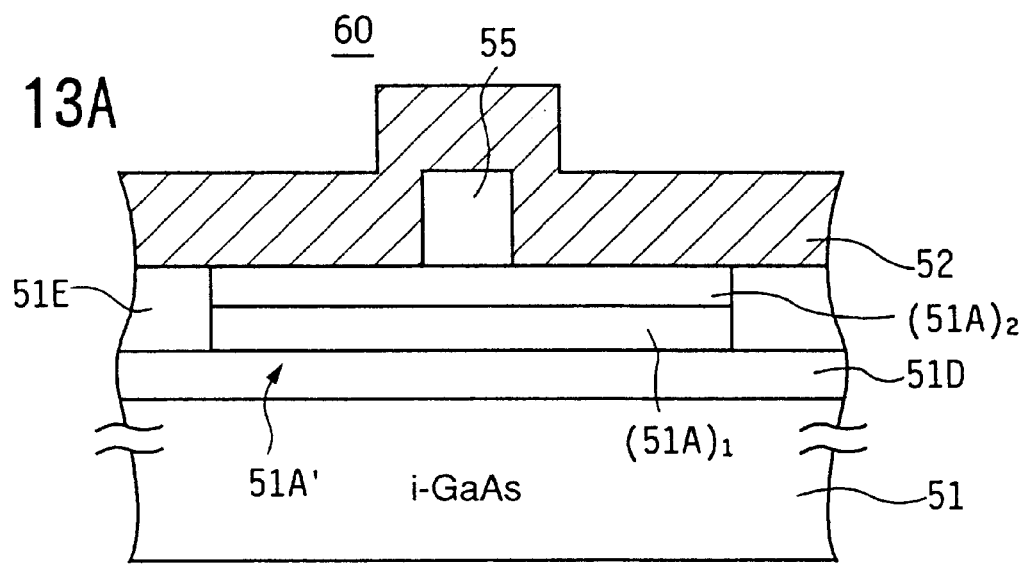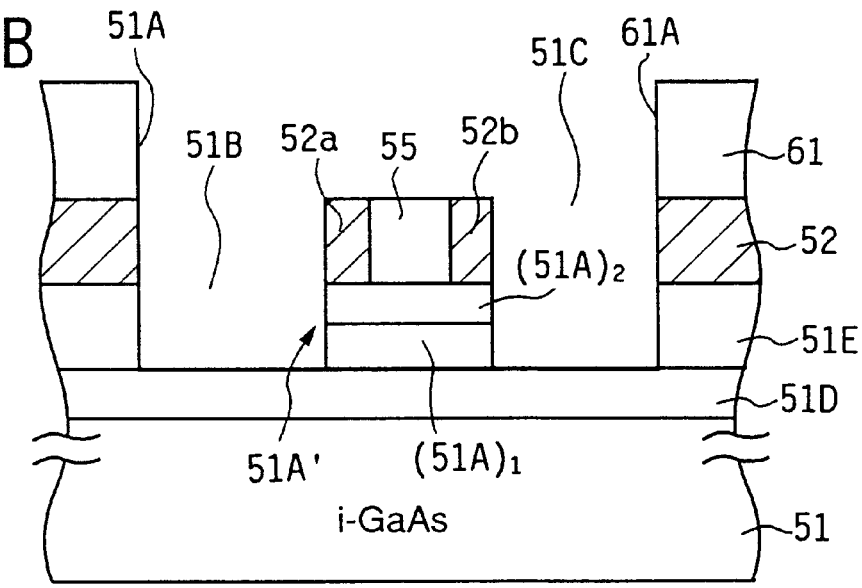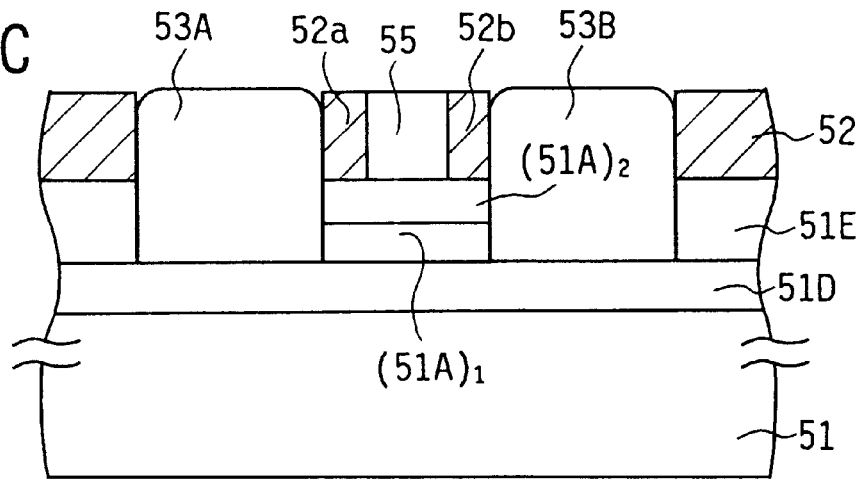

COMPOUND SEMICONDUCTOR DEVICE HAVING A REDUCED SOURCE RESISTANCE

BACKGROUND OF THE INVENTION

The present invention generally relates to semiconductor devices and more particularly to a high-speed compound semiconductor device having a reduced source resistance.

Compound field effect semiconductor devices such as a MESFET or HEMT have a structure in which a gate electrode is provided on a semiconductor substrate that provides a channel layer, and a pair of ohmic electrodes are formed at both lateral sides of the gate electrode as source and drain electrodes. Thereby, the part of the substrate that contacts the source electrode or drain electrode forms a source region or a drain region. In such compound field effect semiconductor devices, it is desired to reduce the resistance of the source region or drain region as much as possible for improving the operational speed of the semiconductor device.

Thus, there has been a proposal to form an ion-implanted region in the substrate in correspondence to the source region or drain region so as to reduce the source resistance or drain resistance of the semiconductor device similarly to the case of a conventional MOS transistor constructed on a Si substrate.

Generally, formation of such an ion-implanted region is achieved by an ion implantation process, wherein an ion implantation process generally includes a thermal annealing process conducted after the step of introducing accelerated ions, as is well known in the art.

In the case of a III-V compound semiconductor device, however, there is a tendency that the group V element such as As or P causes a dissociation during such an annealing process, and thus, it has been necessary to conduct the annealing process in an atmosphere of the foregoing group V element or in a state in which the surface of the compound semiconductor substrate is covered by an insulation film, for avoiding such a dissociation of the group V element.

FIG. 1 shows an example of a conventional annealing process as applied to a GaAs HFET (heterostructure FET).

Referring to FIG. 1, the GaAs HFET is constructed on a semi-insulating GaAs substrate 11 and includes a first compound semiconductor layer 12A of an undoped GaAs or a low-resistance GaAs doped to the p$^-$-type on the foregoing semi-insulating GaAs substrate 11. Further, a second compound semiconductor layer 12B is formed on the first compound semiconductor layer 12A as a channel layer of the semiconductor device, wherein the second compound semiconductor layer 12B may be formed of undoped or n-type GaAs, InGaAs or InGaAsP. It should be noted that the first compound semiconductor layer 12A functions as a carrier blocking barrier preventing a leakage of carriers from the channel layer 12B to the substrate 11. Such a leakage of carriers tends to occur in extremely miniaturized devices in which a short channel effect appears conspicuously.

On the channel layer 12B, a gate electrode 13 of WSi is provided, and the channel layer 12B as well as a part of the carrier blocking layer 12A underneath the channel layer 12B are subjected to an ion implantation process of an n-type dopant such as Si$^+$ at both lateral sides of the WSi gate electrode 13 while using the gate electrode 13 as a self-aligned mask. By applying an annealing process to the structure thus obtained, a source region 12C and a drain region 12D both of the n$^+$-type are formed in the channel layer 12B at both lateral sizes of the gate electrode 13.

When applying an annealing process in such a structure, it is generally practiced to provide an insulation film 14 of $SiO_2$, SiN, AlN or SiON on the substrate 11 for preventing the dissociation of the group V element from the III-V compound semiconductor crystal forming the first or second compound semiconductor layers. Thus, the insulation film 14 is provided so as to cover the channel layer 12B as well as the gate electrode 13 thereon.

After the structure of FIG. 1 is formed, the insulation film 14 is removed selectively, and source and drain electrodes (not illustrated) are formed on the source region 12C and the drain region 12D.

In the foregoing process of FIG. 1, the problem of dissociation occurring in the channel layer 12B, which is essential for the operation of the semiconductor device, is successfully eliminated by conducting the annealing process in the state that the insulation film 14 is provided.

On the other hand, the structure of FIG. 1 includes a triple point A in the structure as indicated, wherein it should be noted that the triple point A is a point in which all of the channel layer 12B, the insulation film 14 and the gate electrode 13 make a contact with each other. Because of the difference in the thermal expansion coefficient, the triple point A tends to accumulate a severe thermal stress, while such a thermal stress in the triple point A tends to induce a stress and hence crystal defects inside the channel layer 12B, particularly in the vicinity of the gate electrode 13. Thereby, the operational performance of the semiconductor device is substantially deteriorated.

Further, the conventional device of FIG. 1 suffers from the problem of difficulty in controlling the profile of the impurity element at the time of the annealing process.

Meanwhile, there is proposed a process of forming a low-resistance source region or a low-resistance drain region by growing a conductive compound semiconductor layer on a compound semiconductor substrate selectively as source and drain regions.

FIGS. 2A–2C show a conventional process of forming a compound field effect semiconductor device 21 carrying the selectively grown source and drain regions.

Referring to FIG. 2A, the semiconductor device is constructed on a semi-insulating GaAs substrate 22 and a channel region 22A of the n-type is formed on the semi-insulating GaAs substrate 22. Further, an insulation layer 23 of SiON is formed on the substrate 22, and the insulation layer 23 is formed with openings 23A and 23B exposing the surface of the substrate 22 in correspondence to the source region and the drain region of the semiconductor device to be formed.

Next, in the step of FIG. 2B, an MOVPE process is conducted by using TMGa (trimethylgallium) or TEGa (triethylgallium) and arsine ($AsH_3$) respectively as a gaseous source of Ga and As, with silane ($SiH_4$) added thereto as a gaseous source of dopant. As a result of the MOVPE process, a source region 24A and a drain region 24B of n$^+$-type GaAs are grown selectively on the substrate 22 in correspondence to the foregoing openings 23A and 23B. Further, a Schottky electrode 25 is formed in the step of FIG. 2C between the source region 4A and the drain region 4B.

FIG. 3 shows the construction of a MOVPE apparatus 30 used in the step of FIGS. 2A–2C, particularly in the step of FIG. 2B, for forming the source region 24A and the drain region 24B by the selective growth process.

Referring to FIG. 3, the MOVPE apparatus 30 includes a reaction chamber 31 in which a holder 31B is provided in a rotatable manner by a motor 31A, wherein the holder 31B carries a susceptor 31C and the susceptor 31C supports thereon a wafer 31D. Further, a heater 31E is provided in the reaction chamber 31 in correspondence to each of the susceptors 31C.

It should be noted that the MOVPE apparatus 30 further includes a carrier gas line 32 to which a carrier gas such as $H_2$ is supplied. Further, the MOVPE apparatus 30 includes gas cylinders 33A and 33B respectively holding an arsine gas and a silane gas as an As source and a dopant, wherein arsine in the cylinder 33A is supplied to the reaction chamber 31 via a valve 33a and a line 34, together with the carrier gas supplied to the foregoing line 32. Similarly, silane in the cylinder 33B is supplied to the reaction chamber 31 together with the carrier gas through the line 32, via a valve 33b and the line 34 cooperating with the gas cylinder 33B.

In addition, the MOVPE apparatus 30 of FIG. 3 includes a bubbler 35A holding a Ga source and a bubbler 35B holding a source of another group III element such as In, wherein each of the bubblers 35A and 35B is supplied with a carrier gas from the line 32 for bubbling. As a result of the bubbling, a gaseous source of Ga is formed in the bubbler 35A and the Ga gaseous source thus formed is supplied to the reaction chamber 31 via a valve 35a and the line 34, together with a gaseous source of the other group III element, which is supplied via a valve 35b and the line 34. Further, the cylinders 33A and 33B are provided with valves 33a' and 33b' for purging. Similarly, the bubblers 35A and 35B are provided with valves 35a' and 35b' for purging, wherein the valves 33a' and 33b' and the valves 35a' and 35b' are connected to a purge line 34' which in turn is connected to an external scrubber (not shown). Further, the reaction chamber 33 itself is evacuated via an exhaust line 36 connected to the scrubber.

When TMGa, a substance commonly used in the art of MOVPE as the source of Ga, is used in such a selective growth process conducted by the system of FIG. 3, there arises a problem in that precipitates 24X are formed on the surface of the insulation film 23 during the process of FIG. 2B for forming the source region 24A and the drain region 24B, wherein such precipitates 24X cause an adversary effect on the device characteristic or yield of the MESFET production. While the composition of the precipitates 24X is not analyzed, it is believed that the precipitate 24X is an organic compound containing Ga and As.

It is known that the problem of formation of such precipitates 24X can be avoided by using DEGaCl (diethylgallium chloride) for the source of Ga. However, DEGaCl has a vapor pressure of only 0.1 Torr or less at the room temperature and cannot provide a sufficient deposition rate necessary for production of the device, particularly when used in the deposition system of FIG. 3 in which the reaction chamber 11 has a large volume for mass production according to a batch process.

It is of course possible to increase the deposition rate even when DEGaCl is used, by increasing the evaporation temperature of the bubbler 35A to 50–60° C. However, such a process is not desirable in view of possible thermal interference caused to the adjacent bubblers such as the bubbler 35B. For example, the heat of the bubbler 35A may be transmitted to the bubbler 35B via gas lines and cause an increase in the temperature of the source material held in the bubbler 35B. It should be noted that the control of the bubbling temperature in the bubblers has to be made exactly, typically within a tolerance of ±1° C.

SUMMARY OF THE INVENTION

Accordingly, it is a general object of the present invention to provide a novel and useful fabrication process of a compound semiconductor device wherein the foregoing problems are eliminated.

Another and more specific object of the present invention is to provide a high-speed compound semiconductor device having a reduced source and drain resistance.

Another object of the present invention is to provide a compound semiconductor device having a low-resistance source region or a drain region formed by an ion implantation process and a fabrication process of such a compound semiconductor device, wherein the problem of dissociation of the compound semiconductor layer forming the semiconductor device at the time of an annealing process is successfully avoided and wherein the problem of thermal stress in the channel layer, in which an on/off control of carriers is achieved, is successfully minimized.

Another object of the present invention is to provide a compound semiconductor device, comprising:

a substrate;

a channel layer formed on said substrate;

a gate electrode formed on said channel layer;

first and second implanted regions formed in said channel layer at both lateral sides of said gate electrode, said first and second implanted regions having a first conductivity type;

first and second protective layers of a compound semiconductor material having said first conductivity type, said first and second protective layers being provided respectively on said first and second implanted regions in contact with said gate electrode; and first and second ohmic electrodes provided respectively on said first and second protective layers.

Another object of the present invention is to provide a method of fabricating a compound semiconductor device including a channel layer formed on a substrate, a gate electrode formed on said channel layer and a pair of diffusion regions formed in said channel layer at both lateral sides of said gate electrode, said method comprising the steps of:

introducing an impurity element into said channel layer while using said gate electrode as a mask by an ion implantation process;

forming first and second protective layers of a compound semiconductor material on said channel layer at both lateral sides of said gate electrode respectively in contact with first and second side walls of said gate electrode;

applying an annealing process to said channel layer in a state in which said first and second protective films cover said channel layer, such that said impurity element forms first and second implanted regions in said channel layer at both lateral sides of said gate electrode as a result of said annealing process respectively in correspondence to said first and second protective films; and forming first and second ohmic electrodes respectively on said first and second ion-implantation regions.

According to the present invention, the problem of dissociation of the compound semiconductor material forming the channel layer at the time of the annealing process is successfully suppressed by forming the first and second protective layers on the channel layer. In the compound semiconductor device of such a construction, it should be noted that the problem of formation of the triple point explained with reference to FIG. 1 is successfully avoided even in the case where an insulation film is provided so as to cover the gate electrode, as the first or second protective layer intervenes between the diffusion region and the insulation film. Thereby, the problem of thermal stress applied to the channel layer, which is critical for the high-speed operation of the semiconductor device, is successfully eliminated.

Another object of the present invention is to provide a process of forming a compound semiconductor device having a low-resistance compound semiconductor layer grown on a compound semiconductor substrate as a source region or a drain region of the compound semiconductor device, wherein the growth of the low-resistance compound semiconductor device is achieved with a rate sufficient for mass producing the compound semiconductor device in a large batch-type deposition apparatus.

Another object of the present invention is to provide a fabrication process of a compound semiconductor device including a semiconductor layer and a III-V compound semiconductor regrowth region formed on said semiconductor layer, said III-V compound semiconductor regrowth region including Ga as a group III element, said method comprising the step of:

forming said regrowth region on said semiconductor layer in a vapor phase deposition apparatus while using dimethylgallium chloride as a source of Ga.

Another object of the present invention is to provide a method of selectively growing, on a first semiconductor layer, a second semiconductor layer of a group III-V compound semiconductor material containing therein Ga as a group III element, comprising the step of:

forming said second semiconductor layer on said first semiconductor layer in a vapor phase deposition apparatus while using dimethylgallium chloride as a source of Ga.

According to the present invention, it is possible to form the regrowth region or the second semiconductor layer with a sufficient deposition rate by using dimethylgallium chloride as a source of Ga, without causing any adversary effect on the vaporization (bubbling) temperature of other source material(s) of the group III element. It should be noted that the vaporization of dimethylgallium chloride can be achieved at a room temperature without problem such as reduced deposition rate. As there is no thermal interference to other bubblers, the process of the present invention is particularly useful for growing a mixed crystal layer for the regrowth layer or the second semiconductor layer, by using a plurality of bubblers or evaporators simultaneously. The process of the present invention that uses dimethylgallium chloride is particularly effective when using a vapor phase growth apparatus having a large volume reactor.

Other objects and further features of the present invention will become apparent from the following detailed description when read in conjunction with the attached drawings.

BRIEF DESCRIPTION OF THE DRAWINGS

FIGS. 13A–13C are diagrams showing the fabrication process of a compound semiconductor device according to a sixth embodiment of the present invention.

DETAILED DESCRIPTION OF THE PREFERRED EMBODIMENTS

FIRST EMBODIMENT

FIGS. 4A–4D are diagrams showing the fabrication process of a HFET according to a first embodiment of the present invention.

Figure 4A:
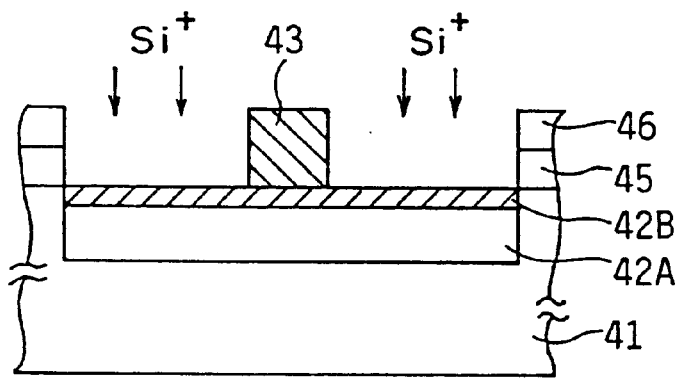
FIGS. 4A–4D are diagrams showing the fabrication process of a compound semiconductor device according to a first embodiment of the present invention.

Referring to FIG. 4A, a depression is formed on a semi-insulating GaAs substrate 41 and a leakage blocking layer 42A of p-type GaAs and a channel layer 42B of an n-type GaAs are formed in the depression consecutively by a regrowth process that may be conducted by an MBE process or an MOVPE process.

After the layers 42A and 42B are thus formed, an insulation film 45 of SiON is provided on the channel layer 42B, and the insulation film 45 is patterned by a photolithographic process while using a resist pattern 46 as a mask to form an opening exposing the channel layer 42B. Further, a gate electrode 43 is formed on the channel layer 42B thus exposed. In the step of FIG. 4A, an ion implantation process of $Si^+$ is conducted further into the channel layer 42B while using the gate electrode 43 as a mask, typically with an acceleration voltage of 90 keV and a dose of $4 \times 10^{13} cm^{-2}$.

Figure 4B:
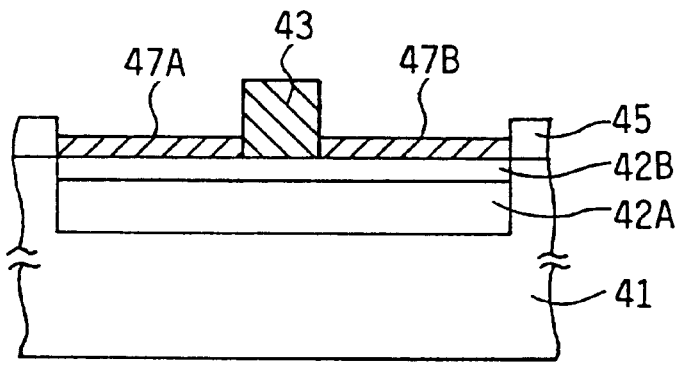

Next, in the step of FIG. 4B, a GaAs region 47A and a GaAs region 47B are formed on the exposed channel layer 42B respectively at the left part and right part of the gate electrode 43 by an MOVPE regrowth process, such that the GaAs regrowth region 47A contacts a left side wall of the gate electrode 43 and such that the GaAs regrowth region 47B contacts a right side wall of the gate electrode 43. It should be noted that the GaAs regrowth regions 47A and 47B act as a protective layer protecting the exposed surface of the channel layer 42B.

Typically, the GaAs protective regrowth regions 47A and 47B are formed to have a thickness of about 30 nm, by setting the substrate temperature to 600–650° C. and a deposition rate of about 12 nm/min. Thereby, it is preferable to use dimethylgallium chloride (DMGaCl) for the source of Ga and arsine for the source of As. Further, disilane is added as a source of the Si dopant. This feature of using DMGaCl will be explained later in detail with reference to other embodiments. Thereby, the problem of formation of precipitates or particles on a mask (insulation film and gate electrode) as in the case of using TMGa (trimethylgallium) or TEGa (triethylgallium) for the Ga source is successfully eliminated. Further, the problem of insufficient deposition rate as in the case of using DEGaCl, is avoided.

Figure 4C:
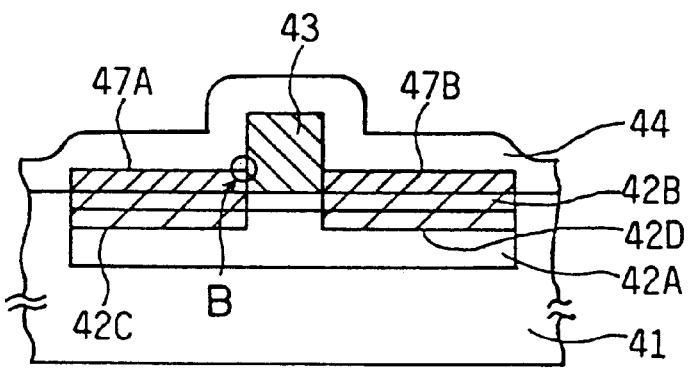

Next, in the process of FIG. 4C, the mask insulation film 45 is removed by an etching process, and an insulation film 44 of SiON, AlN, $SiO_2$, and the like, is formed on the structure of FIG. 4B by a CVD process. After the formation of the insulation film 44, the structure of FIG. 4C is subjected to a thermal diffusion process conducted typically at 800–850° C. for a duration of about 20 minutes, to form diffusion region 47C and 47D in the channel layer 42B at both lateral sides of the gate electrode 43. In the structure of FIG. 4C, it should be noted that the bottom of the diffusion regions 47C and 47D may reach the leakage blocking layer 42A provided underneath the channel layer 42B.

Figure 4D:
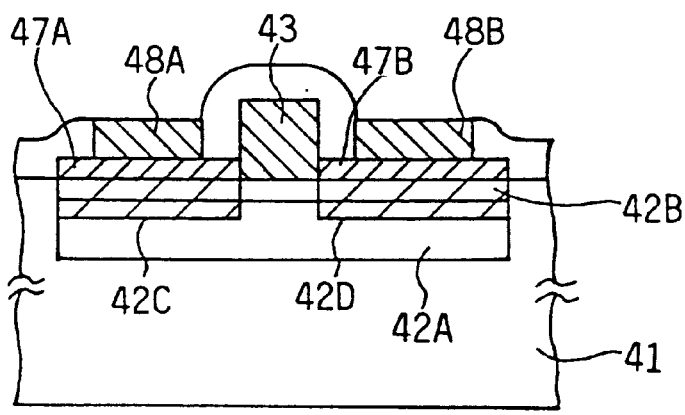

Next, in the step of FIG. 4D, the insulation film 44 is removed and ohmic electrodes 48A and 48B each having an Au/NI/AuGe structure, are formed on the GaAs protective regrowth regions 47A and 47B respectively.

Figure 1:
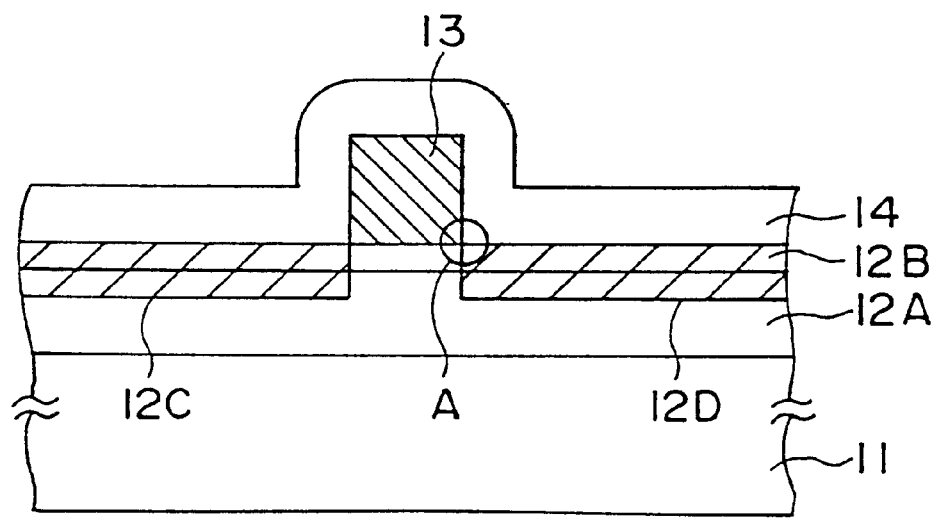
FIG. 1 is a diagram showing the construction of a conventional compound semiconductor device.

In the process of FIGS. 4A–4C, it should be noted that the channel layer 42B, being covered by the GaAs protective regrowth regions 47A and 47B and further by the gate electrode 43, no longer makes a direct contact with the insulation film 44. Thus, the formation of the triple point A explained with reference to FIG. 1 is successfully avoided in the structure of FIG. 4C or 4D. Instead, it should be noted that the structure of FIG. 4C includes a triple point B in which the GaAs protective regrowth region 47A or 47B makes a direct contact simultaneously to the gate electrode 43 and the insulation film 44. As the triple point B thus formed no longer includes the channel layer 42B as a part thereof, the crystal quality of the channel layer 42B and hence the performance of the semiconductor device is not affected by the stress accumulated in the triple point B.

Figure 5:
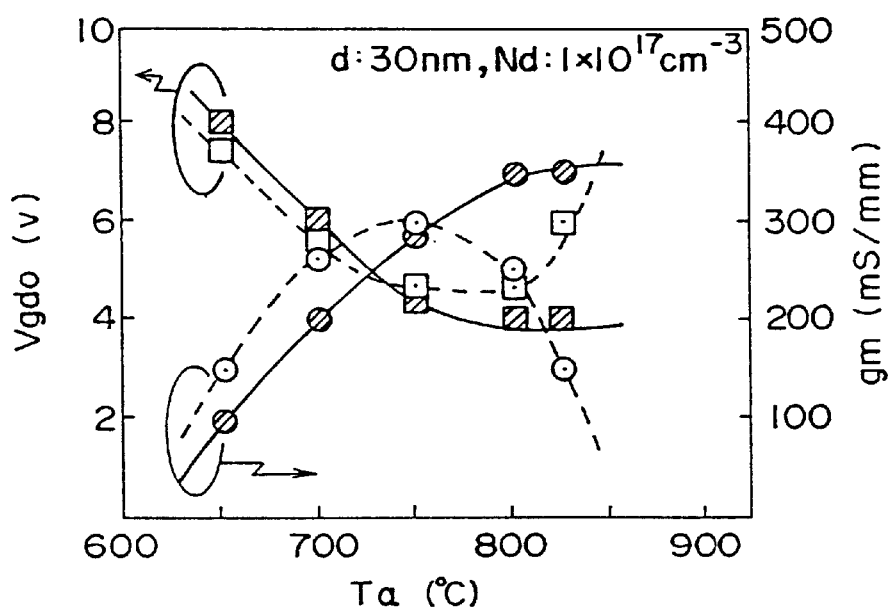
FIG. 5 is a diagram showing an effect of the present invention.

FIG. 5 shows the relationship between the annealing temperature Ta used in the thermal diffusion process and the gate withstand voltage $V_{dg0}$ or transconductance $g_m$, wherein FIG. 5 shows the result for the device obtained by the process of FIGS. 4A–4D by a continuous line and the result for the conventional device of FIG. 1 by a broken line. In the experiment of FIG. 5, it should be noted that the thickness of the protective regrowth regions 47A and 47B is set to 30 nm and the carrier density is set to $1 \times 10^{17} cm^{-3}$.

Referring to FIG. 5, it can be seen that formation of crystal defects starts, in the case of the conventional device of FIG. 1, when the temperature of the thermal diffusion process has exceeded 750° C. as is demonstrated by the drop of the transconductance $g_m$ that starts at the foregoing temperature of about 750° C. as represented by the broken line. Contrary to the conventional device represented by the broken line, the transconductance $g_m$ of the device of the present embodiment continues to increase as indicated by the continuous line even in such a case in which the temperature of the thermal diffusion process has exceeded 850° C. It is believed that this preferable feature of the present embodiment is obtained as a result of the decrease of the sheet resistance in the foregoing diffusion regions 42C and 42D, which is achieved without inducing a substantial defect formation in the channel layer 42B.

Figures 2A, 2B, 2C:
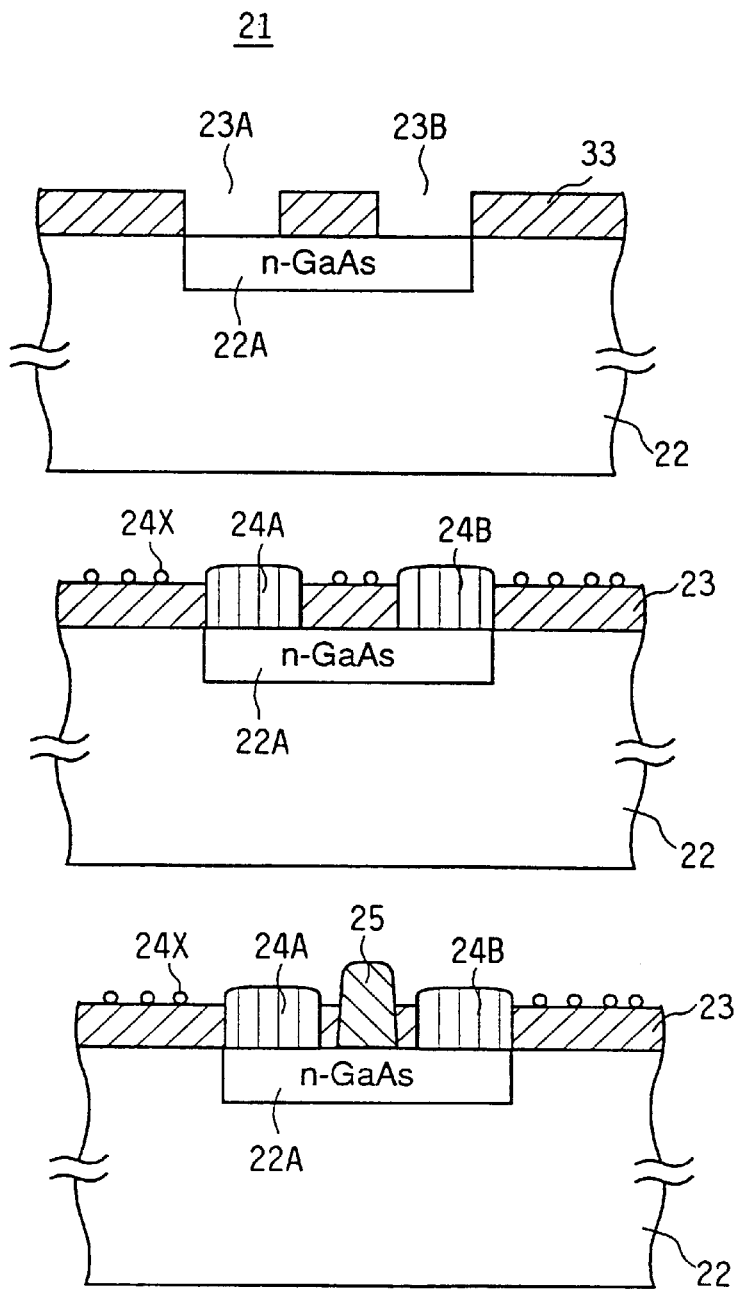
FIGS. 2A–2C are diagrams explaining the problem encountered in a conventional fabrication process of a compound semiconductor device.

Further, FIG. 2 also indicates that the gate withstand voltage $V_{dg0}$ is substantially constant and remains higher than 4 V in the semiconductor device of the present embodiment. In relation to this, it should be noted that there is a remarkable increase of the gate withstand voltage $V_{dg0}b$ in the conventional semiconductor device when the annealing process is conducted at a temperature of 800° C. or higher. However, this increase of the gate withstand voltage $V_{dg0}$ in the conventional device is caused merely as a result of the depletion of the carriers of the first conductivity type in the channel layer 42B and cannot be regarded as an improvement of the device performance.

Figure 6:
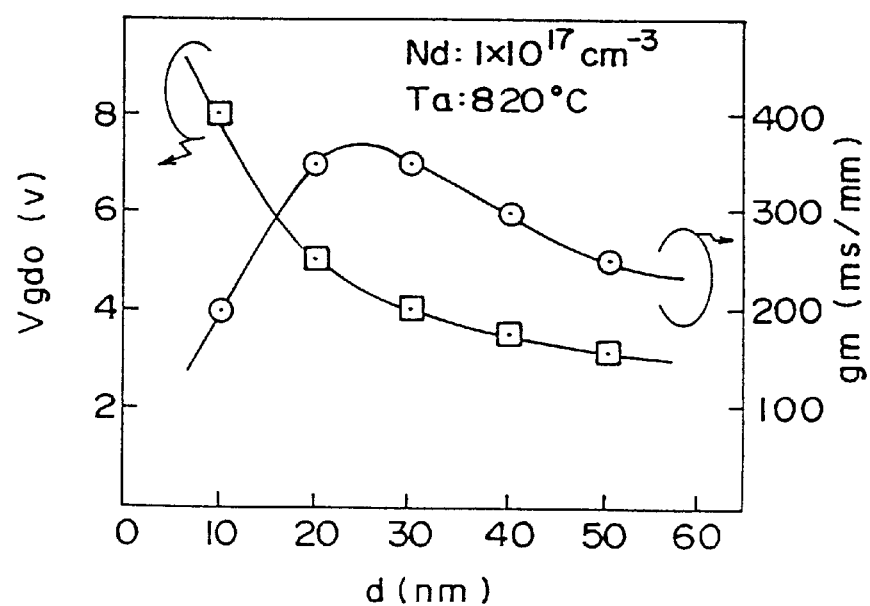
FIG. 6 is another diagram showing an effect of the present invention.

FIG. 6 shows the relationship between the gate withstand voltage $V_{dg0}$ of the semiconductor device of FIGS. 4A–4D and the transconductance $g_m$ for the case in which the thickness d of the regrowth regions 47A and 47B is changed variously. It should be noted that the result of FIG. 6 is for the case in which the thermal annealing temperature Ta is 820° C. and the protective regions 47A and 47B contain carriers with a carrier density of $1 \times 10^{17} cm^{-3}$.

Referring to FIG. 6, it can be seen that the function of the GaAs regrowth region 47A or 47B as the protective layer is deteriorated substantially when the thickness d has decreased below about 20 nm as is demonstrated by the sharp drop of the transconductance $g_m$ which can be seen in the region in which the thickness d is smaller than about 20 nm. When the thickness d is excessive, on the other hand, there occurs an increase of contact resistance as a result of alloying reaction at the time of formation of the ohmic electrodes 48A and 48B. As a result of such an increase in the contact resistance, the transconductance $g_m$ decreases also. FIG. 6 also indicates that the gate withstand voltage $V_{dg0}$ remains stable even when the thickness d is increased. No sharp increase is observed for the gate withstand voltage $V_{dg0}$. From the result of FIG. 6, it is concluded that a preferable thickness of the GaAs regrowth regions 47A and 47B is larger than about 20 nm but not exceeding about 50 nm, more preferably between about 20 nm and about 30 nm.

Figure 7:
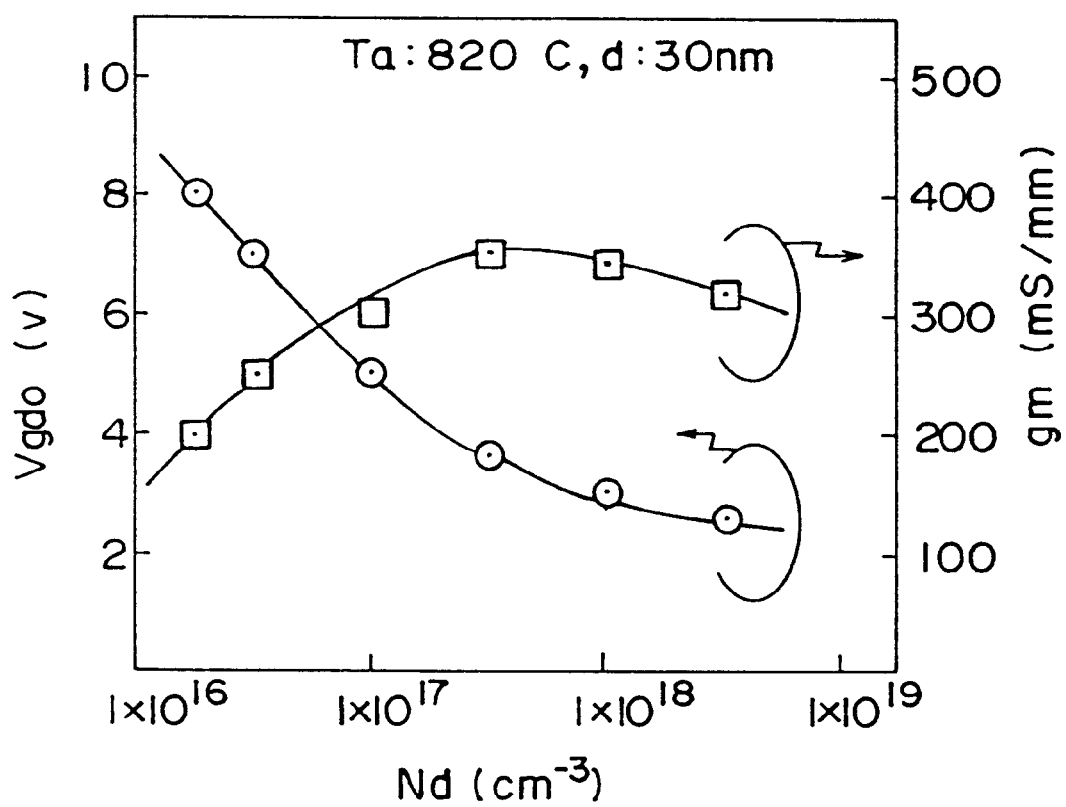
FIG. 7 is a further diagram showing an effect of the present invention.

Further, FIG. 7 shows the relationship between the gate withstand voltage $V_{dg0}$ and the transconductance $g_m$ for the case in which the carrier density $N_d$ in the regrowth region 47A or 47B is changed variously. The result of FIG. 7 is for the case in which the temperature of thermal annealing process is set to 820° C. and the thickness d of the protective regrowth region 47A or 47B to 30 nm.

Referring to FIG. 7, it should be noted that the entire protective regrowth regions 47A and 47B experience a depletion of carriers when the carrier density $N_d$ is set too small. In such a case, there occurs an unwanted increase of the ohmic contact resistance. Thus, the result of FIG. 7 indicates that it is preferable to set the carrier density $N_d$ to be larger than about $1 \times 10^{17} cm^{-3}$ or more. In view of the unwanted decrease of the gate withstand voltage $V_{dg0}$ below 4 V, it is preferable to set the carrier density $N_d$ to be smaller than about $5 \times 10^{17} cm^{-3}$.

SECOND EMBODIMENT

Figure 8A:
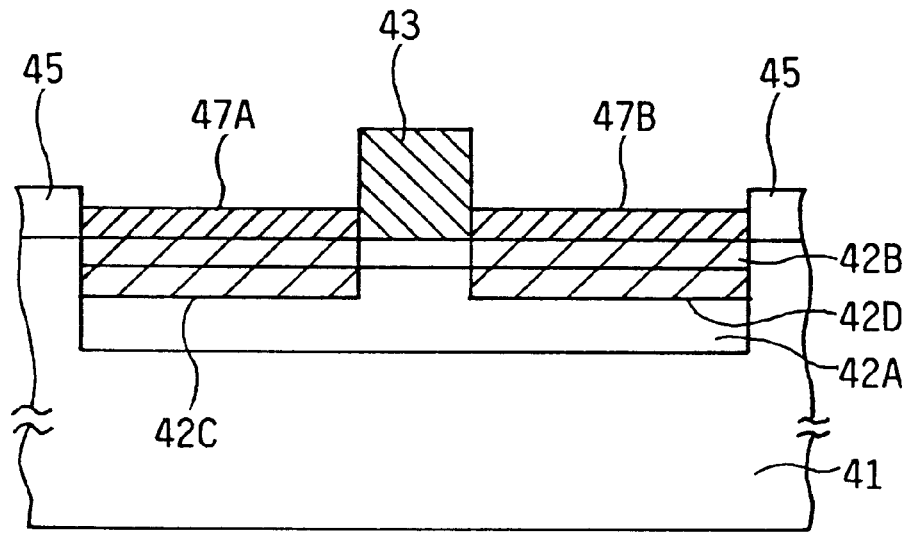
FIGS. 8A and 8B are diagrams showing the fabrication process of a compound semiconductor device according to a second embodiment of the present invention.
Figure 8B:
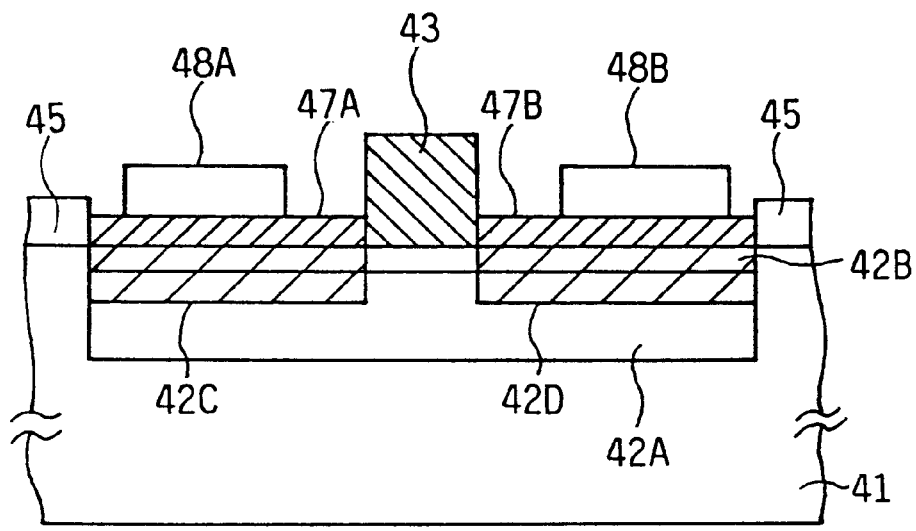

FIGS. 8A and 8B show the fabrication process of a compound semiconductor device according to a second embodiment of the present invention wherein those parts corresponding to the parts described previously are designated by the same reference numerals.

Referring to FIG. 8A showing a thermal diffusion process corresponding to the thermal diffusion process of FIG. 4C, the present embodiment carries out the thermal diffusion process without forming the insulation film 44. In order to avoid the dissociation of As from the regrowth regions 47A and 47B, the thermal annealing process of FIG. 8A is conducted in an As atmosphere. Similarly to the process of the previous embodiment, the thermal diffusion process is conducted at a temperature of 800–820° C. for a duration of about 20 minutes.

After the step of FIG. 8A, the ohmic electrodes 48A and 48B are formed on the protective regrowth regions 47A and 47B respectively.

According to the present embodiment, the thermal diffusion process is conducted in the state that no insulation film 44 is formed on the protective regrowth regions 47A and 47B. Thereby, the thermal stress applied to the channel layer 42B is diminished further as compared with the case of the previous embodiment.

THIRD EMBODIMENT

Figure 9:
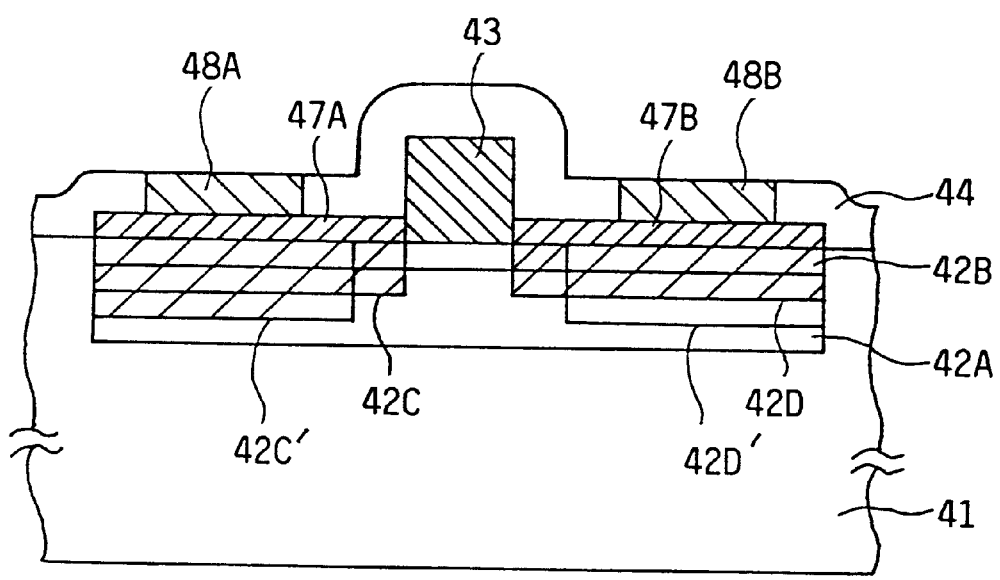
FIG. 9 is a diagram showing the construction of a compound semiconductor device according to a third embodiment of the present invention.

FIG. 9 shows the construction of a compound semiconductor device having an LDD (lightly doped drain) structure according to a third embodiment of the present invention, wherein those parts orresponding to the parts described previously are esignated by the same reference numerals and the description thereof will be omitted.

Referring to FIG. 9, an ion implantation process of $Si^+$ is conducted after the step of FIG. 4C by using the insulation film 44, particularly the part thereof covering the side walls of the gate electrode 43 as a self-alignment mask. By conducting such an additional ion implantation process under an acceleration voltage of about 30 keV and a dose of $5 \times 10^{17} cm^{-2}$, diffusion regions 42C' and 42D' having a higher impurity concentration level are formed in a partially overlapped relationship with the diffusion regions 42C and 42D respectively. Thereby, the device of FIG. 9 has an LDD (lightly doped drain) structure for the source and drain regions. As a result of the LDD construction of FIG. 9, the device of the present embodiment can eliminate the short-channel effect even when the gate length is reduced below about 0.5 $\mu$m.

It should be noted that it has been difficult to fabricate the semiconductor device of FIG. 9 having the LDD structure from the conventional device of FIG. 1 due to the increase of the sheet resistance of the LDD regions 42C and 42D caused by the crystal defects, which in turn is caused by repeated thermal diffusion processes. In the case of the present invention, such an increase of the sheet resistance is successfully avoided by providing the protective regrowth regions 47A and 47B on the channel layer 42B.

FOURTH EMBODIMENT

Figure 10A:
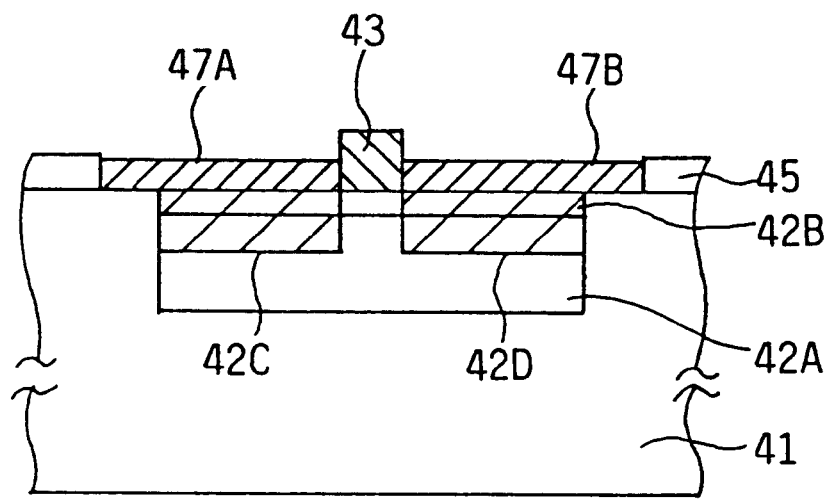
FIGS. 10A and 10B are diagrams showing the construction of a compound semiconductor device according to a fourth embodiment of the present invention.
Figure 10B:
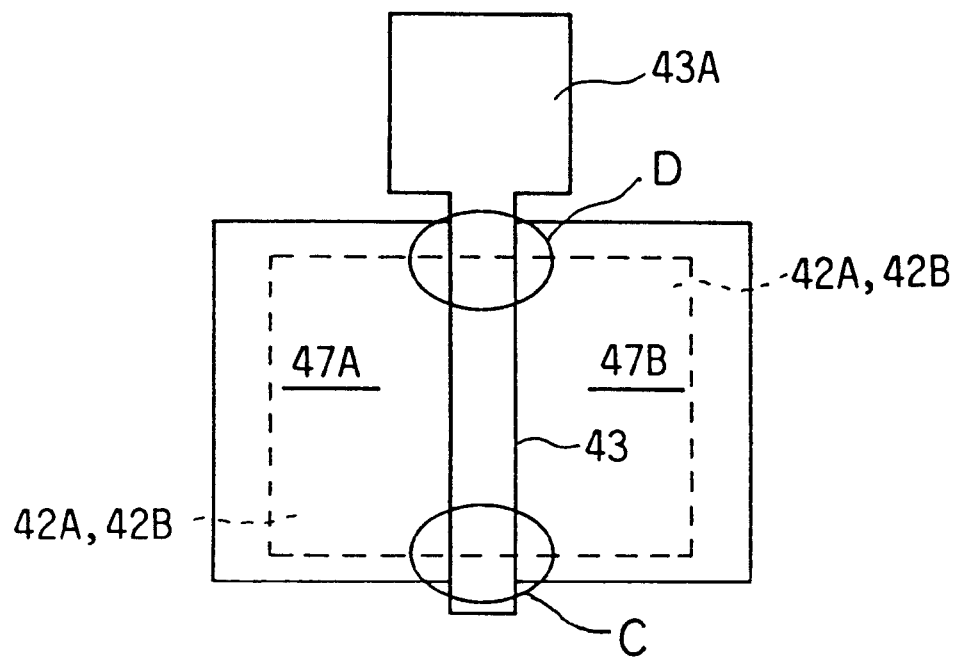

FIGS. 10A and 10B show the construction of a compound semiconductor device according to a fourth embodiment of the present invention respectively in a cross sectional view and in a plan view.

Referring to FIGS. 10A and 10B, the protective regrowth regions 47A and 47B are formed to extend beyond the semiconductor layers 42A and 42B, and the gate electrode 43 having a gate electrode pad 43A at an end thereof extends over the semiconductor layers 47A and 47B, wherein the gate electrode 43 extends beyond the protective regrowth regions 47A and 47B as can be seen in the plan view of FIG. 10A.

In the construction of FIGS. 10A and 10B, the dissociation of the semiconductor layers 42A and 42B in the regions C and D marked in the plan view of FIG. 10B is effectively eliminated by covering the regions C and D entirely by the protective regrowth regions 47A and 47B and by the gate electrode 43 itself. Thereby, the problem of defect formation associated with the dissociation of the semiconductor layers 42A and 42B is effectively suppressed.

FIFTH EMBODIMENT

Figure 11:
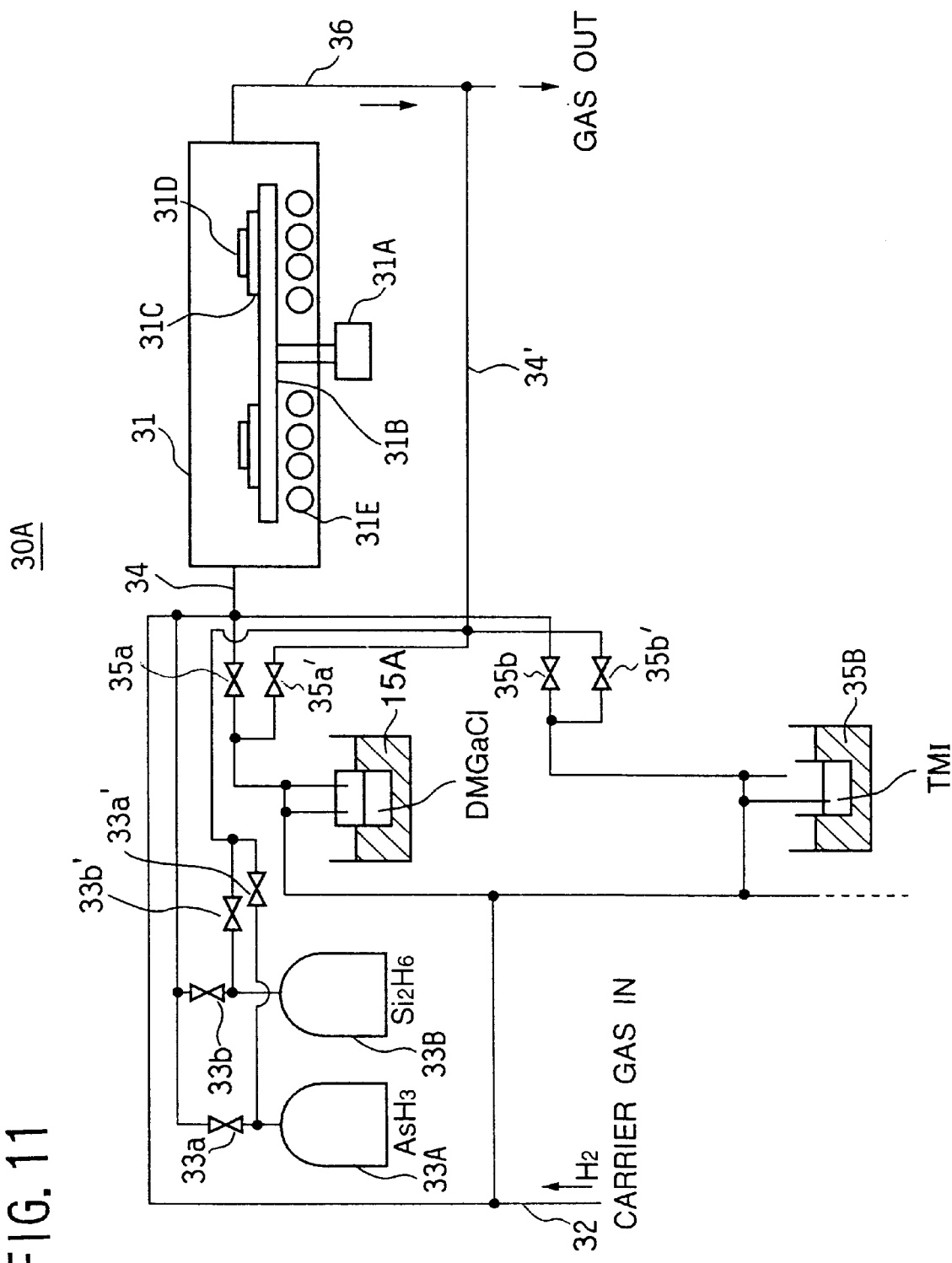
FIG. 11 is a diagram showing the construction of a vapor phase deposition apparatus used in a fifth embodiment of the present invention.

FIG. 11 shows the construction of a vapor phase deposition apparatus 30A used for fabricating a semiconductor device according to a fifth embodiment of the present invention, wherein those parts corresponding to the parts described previously are designated by the same reference numerals and the description thereof will be omitted.

Figure 3:
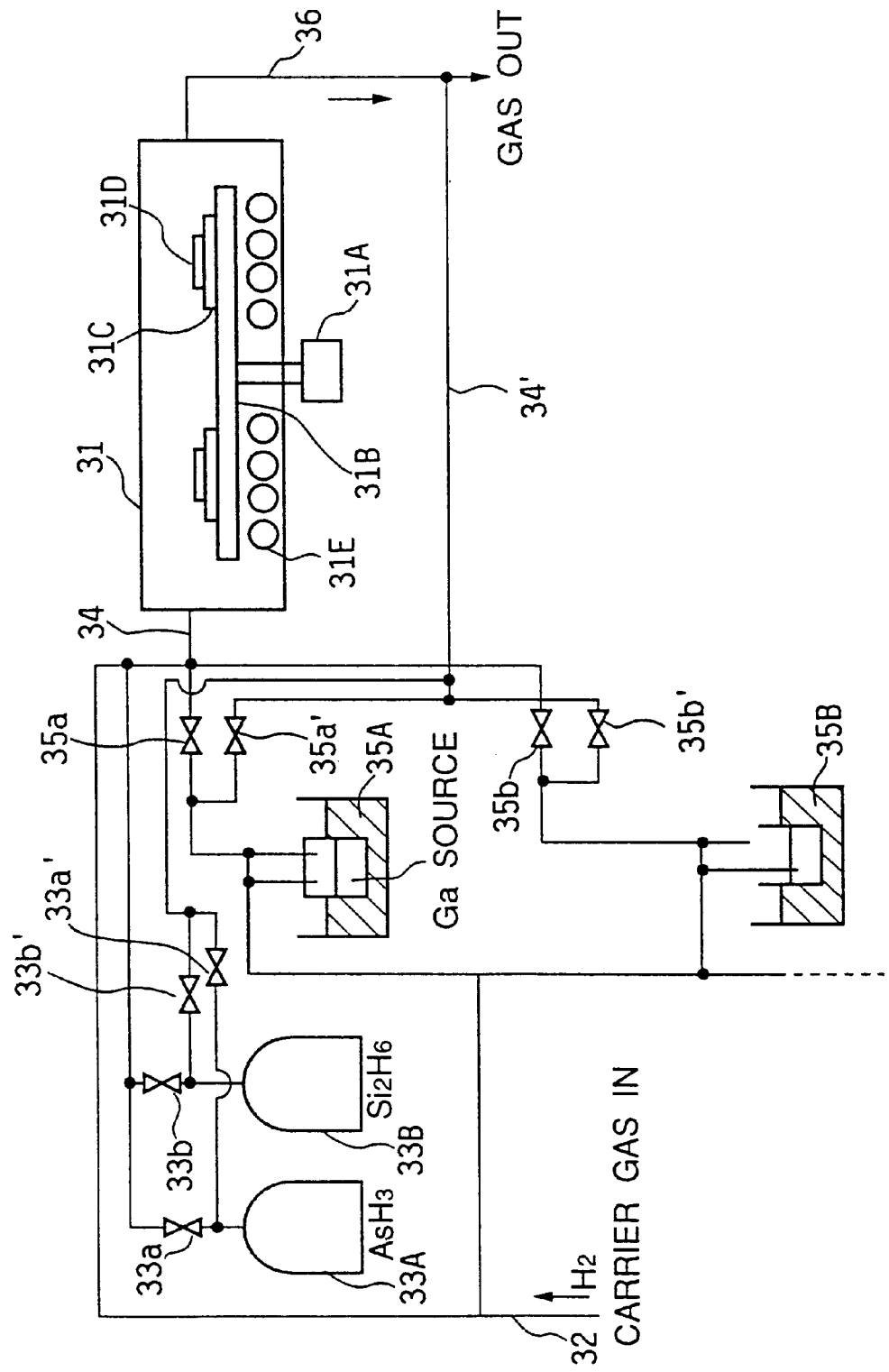
FIG. 3 is a diagram showing the construction of a vapor phase deposition apparatus used in the conventional process of fabricating a compound semiconductor device.

Referring to FIG. 11, the vapor phase deposition apparatus 30A has a construction similar to that of the vapor phase deposition apparatus 30 of FIG. 3 except that an evaporator 15A is used for holding DMGaCl in place of the bubbler 35A, which holds TMGa, for the source of Ga. It should be noted that DMGaCl is a solid at the room temperature. Further, the TMIn (trimethylindium) is held in a bubbler 15B in the illustrated example. It should be noted that the reaction chamber 31 of the deposition apparatus 30A has a very large volume such that a cross-sectional area on the wafer holder is about 700 $cm^2$.

FIGS. 12A–12E show the process of fabricating a MESFET 50 according to a fifth embodiment of the present invention, wherein the process of FIGS. 12A–12E is conducted in the vapor phase deposition apparatus of FIG. 11.

Figure 12A:
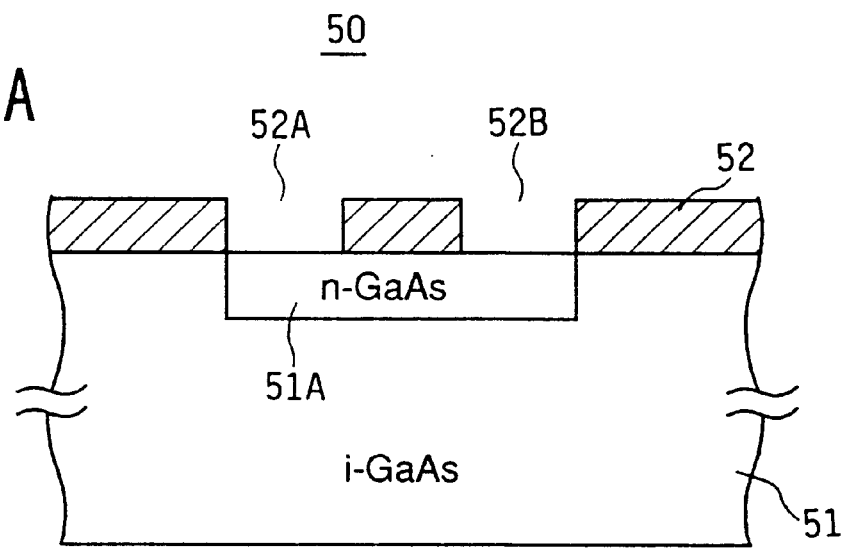
FIGS. 12A–12E are diagrams showing the fabrication process of a compound semiconductor device according to the fifth embodiment of the present invention.

Referring to FIG. 12A, the MESFET 50 is constructed on a semi-insulating GaAs substrate 51, wherein a channel region 51A of the n-type is formed on a part of the semi-insulating GaAs substrate 51 by an ion implantation process and the like. Further, a mask layer 52 of SiON or $SiO_2$ is formed on the substrate 51. The mask layer 52 is formed with openings 52A and 52B exposing the surface of the channel region 51A respectively in correspondence to the source region and the drain region of th MESFET 50 to be formed.

Figure 12B:
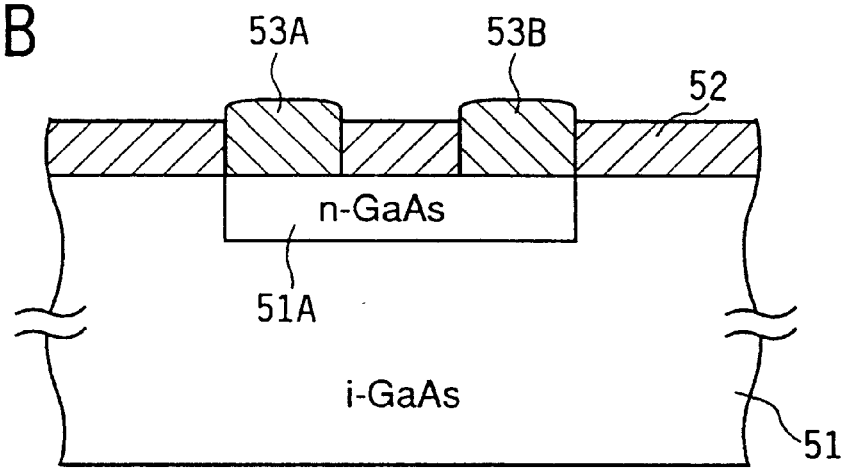

Next, in the step of FIG. 12B, the structure of FIG. 12A is incorporated into the reaction chamber 31 of the deposition apparatus 30A of FIG. 11 as the wafer 31D, and source and drain regions 53A and 53B of $n^+$-type GaAs are grown on the channel layer 51A epitaxially in correspondence to the foregoing openings 52A and 52B as regrowth regions, wherein the regrowth process of the source and drain regions 53A and 53B is achieved by introducing DMGaCl, arsine and silane into the reaction chamber 31 through the line 34 together with the carrier gas of $H_2$ supplied to the line 32. During the regrowth process of the source and drain regions 53A and 53B, the internal pressure of the reaction chamber 31 is set to typically to 50 Torr, and the deposition is made by setting the substrate temperature to 650° C. while supplying the $H_2$ carrier gas to the evaporator 15A with a flow rate of 500 sccm. Further, the temperature of the evaporator 15A is controlled to 20±1° C. The flow rate of arsine may be set to 500 sccm.

In an experiment conducted under the foregoing deposition condition, it was confirmed that a deposition rate of 0.3 nm/sec is achieved for growing the regrowth source and drain regions 53A and 53B, wherein the foregoing experiment was conducted on a wafer having a 4 inch diameter covered by the mask 22 with the proportion of the mask opening area of about 10%.

It should be noted that one may use disilane ($Si_2H_6$) as an n-type dopant in place of silane. In such a case, the carrier density in the regrowth source and drain regions 53A and 53B may be set to $4.5 \times 10^{18} cm^{-3}$ by supplying a disilane gas having a concentration level of 50 ppm to the reaction chamber 31 with a flow rate of 50 sccm.

Figure 12C:
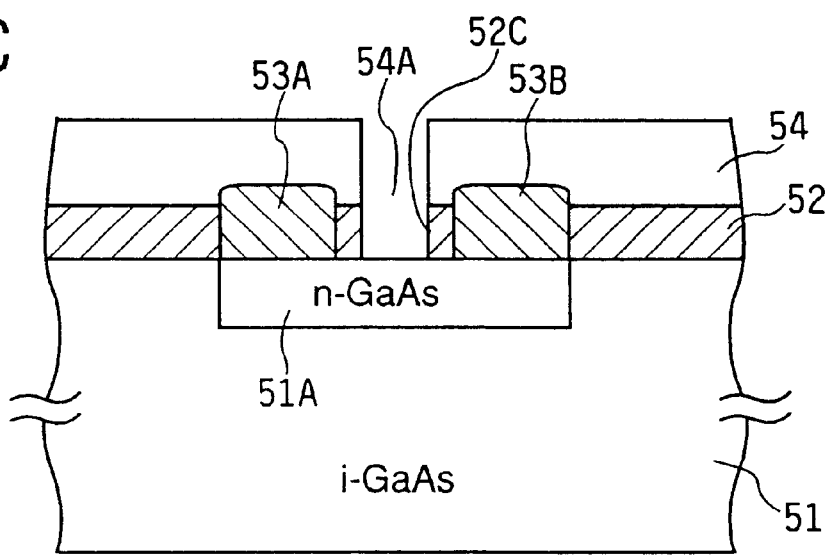
Figure 12D:
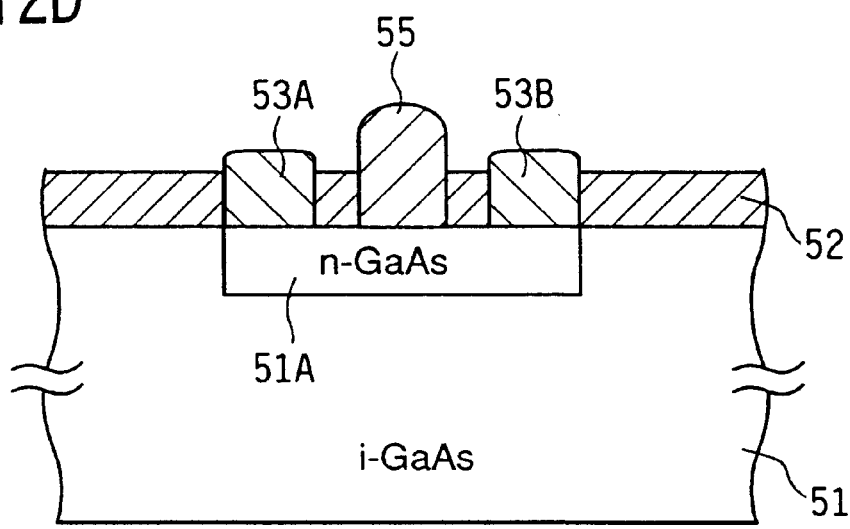

After the step of FIG. 12B, a process of FIG. 12C is conducted in which a resist pattern 54 having an opening 54A is provided on the structure of FIG. 12B and the insulation film 52 is patterned photolithographically by using the resist pattern 54 as a mask, to form an opening 52C in the insulation film 52 in correspondence to a gate electrode to be formed. Further, a gate electrode 55 of a refractory metal compound such as WSi, WTi, WN or WSiN is provided on the channel layer 51A in the step of FIG. 12D so as to fill the foregoing opening 52C, and ohmic electrodes 56A and 56B are formed on the regrowth source region and the drain regions 53A and 53B in the step of FIG. 12E. Further, a passivation film 57 of SiN is provided in the step of FIG. 12E so as to cover the ohmic electrodes 56A and 56B and further the gate electrode 55.

According to the present invention that uses DMGaCl for the Ga source, it is possible to form the regrowth source and drain regions 53A and 53B in the reaction chamber 31 of the deposition apparatus 30A of FIG. 11, without causing the problem of formation of organic Ga precipitates or particles. As DMGaCl allows an evaporation process at the room temperature, it is possible to achieve the regrowth of the source region 53A or the drain region 53B with a sufficient rate, without affecting the bubbling process of other group III elements.

Figure 12E:
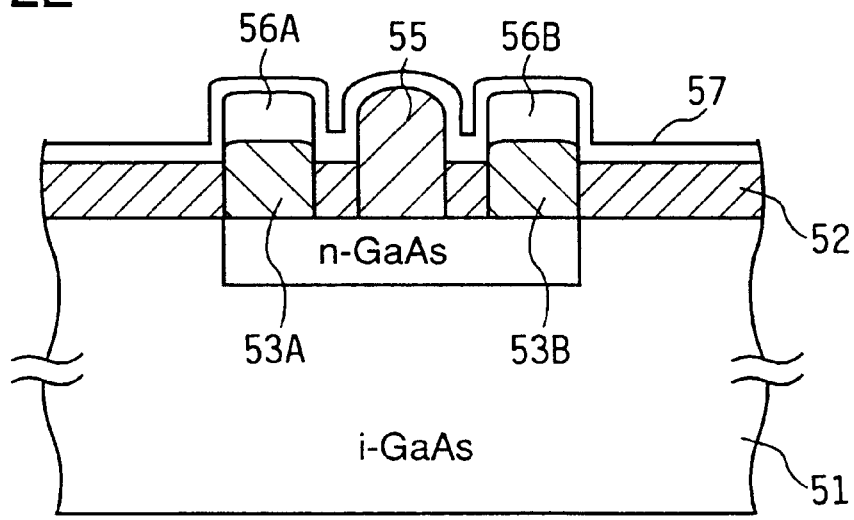

As the semiconductor device of FIG. 12E has the doped source region 53A or the doped drain region 53B formed underneath the ohmic electrode 56A or the ohmic electrode 56B, the semiconductor device has a low resistance for the source or drain and shows an excellent high frequency performance.

Further, it should be noted that the formation of the source region 53A or the drain region 53B is by no means limited to the regrowth process of n-type GaAs but the regrowth regions 53A and 53B may be formed by a regrowth process of a suitable III-V mixed crystal such as AlGaAs, InGaAs or AlGaInAs. When InGaAs is used for the regrowth regions 53A and 53B, in particular, it is possible to eliminate the thermal annealing process that is generally necessary after an ohmic electrode is formed.

As the bubbling process of DMGaCl in the evaporator 15A is conducted at the room temperature in the present invention, the problem of the unwanted change of the bubbling temperature in the adjacent bubbler 15B, which may hold therein TMIn or TMAl, is entirely eliminated and the regrowth process is achieved stably. In the case of conducting a bubbling of TMIn in the bubbler 15B, it should be noted that a temperature regulation of 20±1° C. is necessary.

SIXTH EMBODIMENT

FIGS. 13A–13C show the fabrication process of a MESFET 60 according to a sixth embodiment of the present invention, wherein those parts corresponding to the parts described previously are designated by the same reference numerals and the description thereof will be omitted.

Referring to FIG. 13A, the present embodiment includes an n-type InGaAs layer 51D and an undoped GaAs layer 51E formed consecutively on the GaAs substrate 51, wherein the GaAs layer 51E is formed with an aperture exposing the InGaAs layer 51D underneath the GaAs layer 51E, and a channel structure 51A' is formed so as to fill the foregoing aperture of the GaAs layer 51E. The channel structure 51A' is formed of a stacking of undoped AlGaAs layer (51A)$_1$ having a composition of Al$_{0.25}$Ga$_{0.75}$As and an undoped GaAs layer (51A)$_2$, and the gate electrode 55 is formed on the channel structure 51A'. Similarly as before, the gate electrode 55 may be formed of a refractory metal compound such as WSi, WTi, WN or WSiN, and the gate electrode 55 is covered by the insulation film 52 provided on the substrate 51 in conformity with the shape of the gate electrode 55.

Next, the step of FIG. 13B is conducted in which a resist pattern 61 having an aperture 61A exposing the channel structure 51A' is provided on the structure of FIG. 13A and an anisotropic etching process is conducted generally perpendicularly to the principal surface of the substrate 51 while using the resist pattern 51A as a mask. As a result of the dry etching process, side wall insulation films 52a and 52b are formed at both lateral sides of the gate electrode 55. Further, the substrate 51 is subjected to an anisotropic dry etching process acting in the direction generally perpendicularly to the principal surface of the substrate 51 while using the resist pattern 61, the gate electrode 55 and the side wall insulation films 52a and 52b as an etching mask. As a result of the dry etching process, openings 51B and 51C exposing the surface of the InGaAs layer 51D are formed at both lateral sides of the gate electrode 55.

Next, in the step of FIG. 13C, the structure of FIG. 13B is incorporated, after removing the resist pattern 61, into the reaction chamber 31 of the MOVPE deposition apparatus 30A of FIG. 11 and the regrowth source and drain regions 53A and 53B of n$^+$-type GaAs are grown so as to fill the foregoing openings 51B and 52C.

In the MESFET 60 of the present embodiment, it should be noted that the source or drain resistance of the device is reduced as a result of the regrowth source and drain regions 53A and 53B of the n$^+$-type formed at both lateral sides of the gate electrode 55 in contact with the channel layer 51D of n-type InGaAs.

After the step of FIG. 13C, ohmic electrodes (not shown) are formed on the regrowth source and drain regions 53A and 53B.

In any of the foregoing embodiments, it should be noted that the regrowth source and drain regions 53A and 53B are by no means limited to GaAs but may be formed of AlGaAs, InGaAs or a mixed crystal thereof.

Further, the present invention is by no means limited to the embodiments described heretofore, but various variations and modifications may be made without departing from the scope of the invention.

What is claimed:

1. A method of fabricating a compound semiconductor device including a channel layer formed on a substrate, a gate electrode formed on said channel layer and a pair of diffusion regions formed in said channel layer at both lateral sides of said gate electrode, said method comprising the steps of:

introducing an impurity element into said channel layer while using said gate electrode as a mask by an ion implantation process;

forming first and second protective layers of a compound semiconductor material on said channel layer at both lateral sides of said gate electrode respectively in contact with first and second side walls of said gate electrode;

applying an annealing process to said channel layer in a state in which said first and second protective layers cover said channel layer, such that said impurity element forms first and second diffusion regions in said channel layer at both lateral sides of said gate electrode as a result of said annealing process respectively in correspondence to said first and second protective layers; and forming first and second ohmic electrodes respectively on said first and second diffusion regions.

2. A method as claimed in claim 1, wherein said first and second protective layers are formed epitaxially.

3. A method as claimed in claim 1, wherein each of said first and second protective layers is doped to a conductivity type of said impurity element.

4. A method as claimed in claim 1, wherein said step of annealing process is conducted in a state in which said first and second protective layers are covered by an insulation film, and wherein said method further includes the step of removing said insulation film after said step of annealing process but before said step of forming ohmic electrodes.

5. A method of fabricating a compound semiconductor device including a semiconductor layer and a III-V compound semiconductor regrowth region formed on said semiconductor layer, said III-V compound semiconductor regrowth region including Ga as a group III element, said method comprising the step of:

forming said regrowth region on said semiconductor layer in a vapor phase deposition apparatus while using dimethylgallium chloride as a source of Ga, said step of forming said regrowth region being conducted by using an insulation film as a mask.

6. A method as claimed in claim 5, wherein said group III-V compound semiconductor regrowth region is formed of a mixed crystal of a group III-V compound semiconductor material including Ga and another group III element.

7. A method as claimed in claim 5, wherein said group III-V compound semiconductor regrowth region is formed of a mixed crystal of AlGaAs.

8. A method as claimed in claim 5, wherein said group III-V compound semiconductor regrowth region is formed of a mixed crystal of InGaAs.

9. A method as claimed in claim 5, wherein said group III-V compound semiconductor regrowth region is formed of a mixed crystal of AlGaInAs.

10. A method as claimed in claim 5, wherein said step of forming said regrowth region includes a step of bubbling a source material of dimethylgallium chloride at a room temperature.

11. A method as claimed in claim 5, wherein said step of forming said regrowth region is conducted by using either of a metal or a metal compound as a mask.

12. A method as claimed in claim 5, wherein said step of forming said regrowth region is conducted while using either of a metal or a metal compound with an insulation film as a mask.

13. A method as claimed in claim 5, wherein said step of forming said regrowth region is conducted in a vapor phase deposition apparatus.

14. A method of selectively growing, on a first semiconductor layer, a second semiconductor layer of a group III-V compound semiconductor material containing therein Ga as a group III element, comprising the step of:

forming said second semiconductor layer on said first semiconductor layer in a vapor phase deposition apparatus while using dimethylgallium chloride as a source of Ga, said step of forming said second semiconductor layer being conducted by using an insulation film as a mask.

15. A method as claimed in claim 14, wherein said group III-V compound semiconductor material includes Ga and another group III element.

16. A method as claimed in claim 14, wherein said group III-V compound semiconductor material is formed of a mixed crystal of AlGaAs.

17. A method as claimed in claim 14, wherein said group III-V compound semiconductor material is formed of a mixed crystal of InGaAs.

18. A method as claimed in claim 14, wherein said group III-V compound semiconductor material is formed of a mixed crystal of AlGaInAs.

19. A method as claimed in claim 14, wherein said step of forming said second semiconductor layer includes a step of bubbling a source material of dimethylgallium chloride at a room temperature.

20. A method as claimed in claim 14, wherein said step of forming said second semiconductor layer is conducted by using either of a metal or a metal compound as a mask.

21. A method as claimed in claim 14, wherein said step of forming said second semiconductor layer is conducted while using either of a metal or a metal compound with an insulation film as a mask.

22. A method as claimed in claim 14, wherein said step of forming said second semiconductor layer is conducted in a batch-type vapor phase deposition apparatus.

* * * * *